(12) United States Patent
Funaki et al.

(10) Patent No.: US 10,727,295 B2
(45) Date of Patent: Jul. 28, 2020

(54) WAFER LEVEL PACKAGE AND CAPACITOR

(71) Applicant: Murata Manufacturing Co., Ltd., Nagaokakyo-shi, Kyoto-fu (JP)

(72) Inventors: Tatsuya Funaki, Nagaokakyo (JP); Noriyuki Inoue, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 3 days.

(21) Appl. No.: 16/176,506

(22) Filed: Oct. 31, 2018

(65) Prior Publication Data
US 2019/0074347 A1 Mar. 7, 2019

Related U.S. Application Data

(63) Continuation of application No. PCT/JP2017/016814, filed on Apr. 27, 2017.

(30) Foreign Application Priority Data

May 13, 2016 (JP) .................. 2016-097246

(51) Int. Cl.
| | |
|---|---|
| *H01L 29/00* | (2006.01) |
| *H01L 49/02* | (2006.01) |
| *H01G 4/33* | (2006.01) |
| *H01G 4/12* | (2006.01) |
| *H01L 21/56* | (2006.01) |
| *H01L 23/525* | (2006.01) |
| *H01L 23/522* | (2006.01) |
| *H01L 23/00* | (2006.01) |

(Continued)

(52) U.S. Cl.
CPC ............... *H01L 28/40* (2013.01); *H01G 4/12* (2013.01); *H01G 4/33* (2013.01); *H01L 21/568* (2013.01); *H01L 23/12* (2013.01); *H01L 23/481* (2013.01); *H01L 23/49816* (2013.01); *H01L 23/525* (2013.01); *H01L 23/5223* (2013.01); *H01L 24/18* (2013.01); *H01L 23/3114* (2013.01); *H01L 2224/02377* (2013.01); *H01L 2224/04105* (2013.01); *H01L 2224/12105* (2013.01); *H01L 2224/19* (2013.01)

(58) Field of Classification Search
CPC ..... H01L 21/568; H01L 23/12; H01L 23/481; H01L 23/49816; H01L 23/5223; H01L 23/525; H01L 24/18; H01L 28/40; H01G 4/12; H01G 4/33
USPC ........................................ 257/532
See application file for complete search history.

(56) References Cited

U.S. PATENT DOCUMENTS 9,572,261 B2 * 2/2017 Romig .................. H05K 1/185
2016/0329158 A1 11/2016 Hattori et al.

FOREIGN PATENT DOCUMENTS

| JP | 2004095836 A | 3/2004 |
|---|---|---|
| JP | 2004172526 A | 6/2004 |

(Continued)

OTHER PUBLICATIONS

International Search Report issued for PCT/JP2017/016814, dated Jul. 11, 2017.

(Continued)

*Primary Examiner* — Luan C Thai
(74) *Attorney, Agent, or Firm* — Arent Fox LLP

(57) ABSTRACT

A wafer level package which includes an IC chip; a rewiring layer on the IC chip; and a capacitor embedded in the rewiring layer.

13 Claims, 8 Drawing Sheets

(51) Int. Cl.
*H01L 23/12* (2006.01)
*H01L 23/48* (2006.01)
*H01L 23/498* (2006.01)
*H01L 23/31* (2006.01)

(56) References Cited

FOREIGN PATENT DOCUMENTS

| | | |
|---|---|---|
| JP | 2008227266 A | 9/2008 |
| JP | 2013131459 A | 7/2013 |
| WO | 2015118901 A1 | 8/2015 |

OTHER PUBLICATIONS

Written Opinion of the International Searching Authority issued for PCT/JP2017/016814, dated Jul. 11, 2017.

* cited by examiner

FIG. 9 – PRIOR ART

FIG. 10 - PRIOR ART
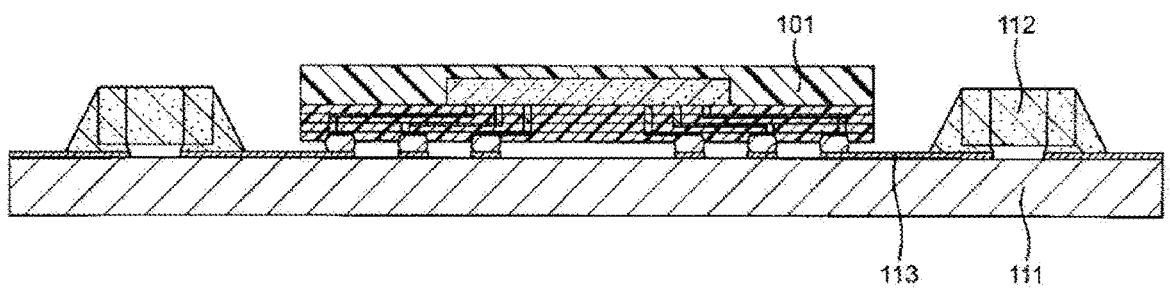

WAFER LEVEL PACKAGE AND CAPACITOR

CROSS REFERENCE TO RELATED APPLICATIONS

The present application is a continuation of International application No. PCT/JP2017/016814, filed Apr. 27, 2017, which claims priority to Japanese Patent Application No. 2016-097246, filed May 13, 2016, the entire contents of each of which are incorporated herein by reference.

FIELD OF THE INVENTION

The present invention relates to a wafer level package. More particularly, the present invention relates to a wafer level package including capacitors embedded in a rewiring layer.

BACKGROUND OF THE INVENTION

In recent years, as electronic devices are mounted more densely, electronic parts are more than ever required to be small and multifunctional. However, an electronic part is generally mounted on an individual circuit board. This mounting method has a limitation in high density mounting since the area on the circuit board is limited.

With regard to the above problem, there is a known method for packaging an electronic part, i.e., an IC chip in particular, and mounting the electronic part as the package on a substrate. As one of these packages, a wafer level package (also referred to as a "WLP" below) is known (Patent Document 1). As illustrated in FIG. 9, a typical WLP 101 includes a semiconductor substrate (IC chip) 102, resin layers 103 which are provided covering the IC chip 102, a rewiring layer 106 which includes rewiring wires 104 and vias 105 in the IC chip 102 and the resin layers 103, connection pads 107 which are exposed from the rewiring layer 106, and solder balls 108 which are provided on the connection pads 107.

Patent Document 1: Japanese Patent Application Laid-Open No. 2004-95836

SUMMARY OF THE INVENTION

The above WLP 101 is mounted on a circuit board 111 illustrated in FIG. 10. However, the inventors of the present invention have found the following problem. When a conventional WLP is used and there are other parts such as capacitor chips 112 on the circuit board 111, the capacitor chips and the IC chip need to be connected via wires 113 on the circuit board 111, and the wires between the capacitor chips and the IC chip become long. In this case, parasitic inductances of these wires become relatively high, and electric characteristics lower. That is, for example, there is a problem that a function of suppressing fluctuation of a power supply voltage with respect to the IC chip operating at a high speed, and a function of absorbing a high frequency ripple lower. Furthermore, the capacitor chips occupy a certain region of the circuit board, and therefore also have a problem that the capacitor chips are not suitable for miniaturization.

It is therefore an object of the present invention to provide an element which can shorten wire lengths between an IC chip and capacitors as much as possible in a circuit including the IC chip and the capacitors and which is further suitable for miniaturization.

As a result of intensive study to solve the above problems, the inventors of the present invention have found that when capacitors are embedded in a wafer level package instead of being mounted on a circuit board, it is possible to obtain the wafer level package which can shorten wire lengths between an IC chip and capacitors and further is suitable for miniaturizing the circuit board.

According to the first aspect of the present invention, there is provided a wafer level package which includes an IC chip; a rewiring layer on the IC chip; and a capacitor which is embedded in the rewiring layer.

According to the second aspect of the present invention, there is provided an electronic device which includes a circuit board on which the above wafer level package is mounted.

According to the third aspect of the present invention, there is provided a capacitor which includes a conductive porous base; a dielectric layer on the conductive porous base; and an upper electrode on the dielectric layer, and in which an outermost layer of at least one first primary surface of the capacitor is a solder plated layer or a metal nano grain layer.

According to the present invention, the capacitors are embedded in the wafer level package, so that it is possible to improve electric characteristics and further easily achieve miniaturization.

BRIEF EXPLANATION OF THE DRAWINGS

FIG. 9 is a schematic cross-sectional view of a conventional wafer level package 101.

FIG. 10 is a schematic cross-sectional view of a circuit board 111 on which the conventional wafer level package 101 is mounted.

DETAILED DESCRIPTION OF THE INVENTION

Hereinafter, a wafer level package according to the present invention will be described in detail with reference to the drawings. In this regard, the shape and an arrangement of each component of the wafer level package according to the present embodiment are not limited to illustrated examples.

First Embodiment

Figure 1:
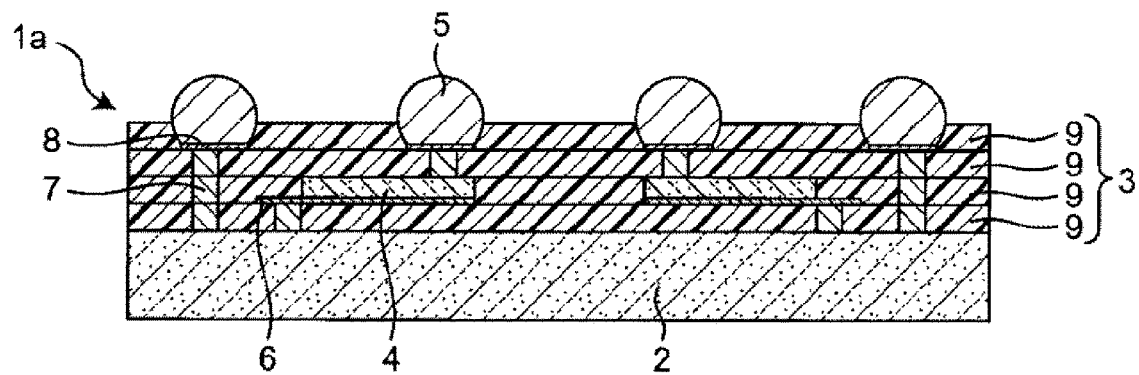
FIG. 1 is a schematic cross-sectional view of a wafer level package 1a according to one embodiment of the present invention.

FIG. 1 is a schematic cross-sectional view of a wafer level package 1a according to one embodiment of the present invention. As illustrated in FIG. 1, the wafer level package 1a according to the present embodiment schematically includes an IC chip 2, a rewiring layer 3 which is provided on the IC chip 2, capacitors 4 which are embedded in the rewiring layer 3, and solder balls 5 which are provided on the rewiring layer 3. The rewiring layer 3 includes wires 6, vias 7 and connection pads 8. Electrodes of the IC chip 2 are electrically connected with the solder balls 5 through the wires 6, the vias 7 and the connection pads 8 (partially through the capacitors 4, as well) provided in the rewiring layer 3.

The IC (integrated circuit) chip may be a semiconductor substrate including a circuit such a transistor formed on a single side surface of an Si substrate or a GaAs substrate, or may be an element including the semiconductor substrate. Preferably, the IC chip is the semiconductor substrate itself including a circuit formed on the single side surface. In the present embodiment, the IC chip includes two primary surfaces. In this description, a primary surface on which an electrode (i.e., a circuit) of an integrated circuit exists will be referred to as an "upper primary surface" (an upper surface in FIG. 1). The other primary surface will be referred to as a "lower primary surface" (a lower surface in FIG. 1).

In addition, there is only one IC chip in the illustrated wafer level package. However, the number of the IC chip is not limited to this and may be two or more, i.e., may be two, three, four or five. Furthermore, when there is a plurality of IC chips, these IC chips may be the same chips or different chips.

In the present embodiment, the rewiring layer 3 is provided in an upper region of the IC chip 2. That is, the wafer level package according to the present embodiment is a so-called Fan-In type. The upper region of the IC chip means a space above the upper primary surface on which the electrodes of the IC chip exist, and a spatial region falling within a region where the upper primary surface exists in a plan view seen from the upper primary surface side of the IC chip.

The rewiring layer 3 includes a plurality of insulation layers 9, the wires 6, the vias 7 and the connection pads 8. The insulation layer 9 includes the vias 7 which penetrate the insulation layer and/or the wires 6 which are formed on the insulation layer, and these insulation layers are laminated such that the vias 7 and wires 6 are electrically connected to each other. Furthermore, the connection pads 8 are provided to be exposed from an upper portion of the rewiring layer 3. Preferably, an insulation layer including through-holes at portions at which the solder balls 5 are provided is installed in an outermost layer (uppermost layer). The rewiring layer 3 has a function of converting, by using the wires 6 and vias 7, an electrode pitch of the IC chip into a pitch suitable for connection with another electric element such as the circuit board on which the wafer level package is mounted.

A material for constituting the insulation layers 9 is not limited in particular as long as this material is an insulation material. A resin or a ceramics is used for this material. This material is preferably a resin, and more preferably a heat resistant resin, such as polyimide, polybenzoxazole, polyethylene terephthalate, a benzocyclobutene resin or an epoxy resin. Furthermore, this material may include a filler such as an Si filler for adjusting a linear expansion coefficient.

The thickness of the insulation layer 9 is not limited in particular, and may be, for example, 1 µm or more and 1.0 mm or less, preferably 10 µm or more and 200 µm or less and, for example, 20 µm or more and 100 µm or less.

The number of the insulation layers 9 is not limited in particular, and may be two or more and 10 or less and preferably three or more and six or less.

A material for constituting the wires 6 is not limited in particular as long as this material has conductivity, and includes, for example, Au, Pb, Pd, Ag, Sn, Ni, Cu or an alloy including these elements. The material for constituting the wires 6 is preferably Cu.

A material for constituting the vias 7 is not limited in particular as long as this material has conductivity, and includes, for example, Au, Pb, Pd, Ag, Sn, Ni, Cu or an alloy including these elements. The material for constituting the vias 7 is preferably Cu.

A material for constituting the connection pads 8 is not limited in particular as long as this material has conductivity, and includes, for example, Au, Pb, Pd, Ag, Sn, Ni, Cu or an alloy including these elements. The material for constituting the connection pads 8 is preferably Cu.

The material for constituting the wires 6, the material for constituting the vias 7 and the material for constituting the connection pads 8 may be the same or different. The material for constituting the wires 6 and the material for constituting the vias 7 are preferably the same. The material for constituting the wires 6, the material for constituting the vias 7 and the material for constituting the connection pads 8 are more preferably the same.

The solder balls 5 function as connection materials which connect the wafer level package to the circuit board and the like. The wafer level package includes the solder balls, and is easily connected by reflow.

The material for constituting the solder balls 5 is not limited in particular, and includes, for example, an SnAg-based, SnCu-based, SnSb-based or SnBi-based Pb free solder or a solder containing Pb such as Sn-37Pb.

In addition, the solder balls are not indispensable elements in the present invention, and do not need to exist. Furthermore, the solder balls can be replaced with other elements such as conductive adhesive materials having the same function.

The capacitors 4 are not limited in particular, and various types of capacitors can be used.

According to a preferred embodiment, the capacitor 4 is a capacitor including a conductive porous base, a dielectric layer which is located on the conductive porous base, and an upper electrode which is located on the dielectric layer. This capacitor has a large substrate surface area and can obtain a large capacitance, and therefore is advantageous.

Figure 2:
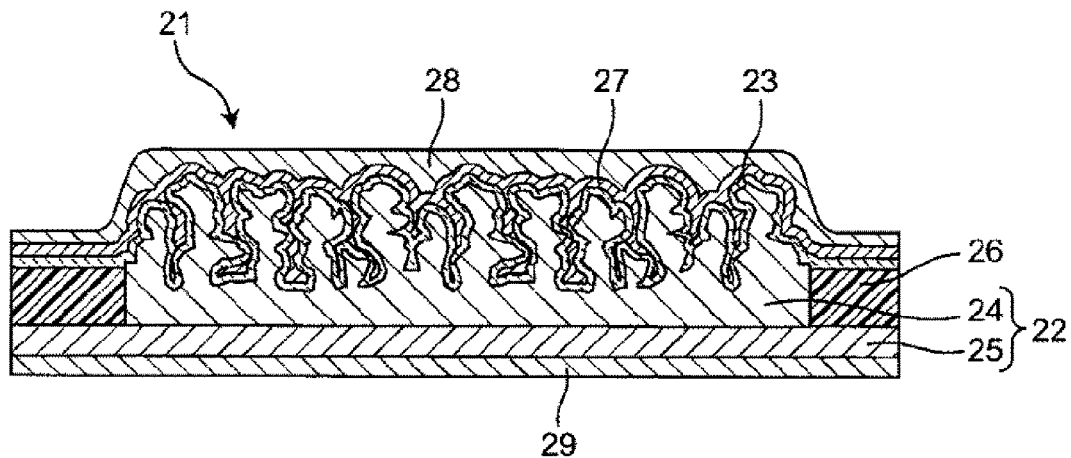
FIG. 2 is a schematic cross-sectional view of a capacitor 21 used in the wafer level package according to the present invention.
Figure 3:
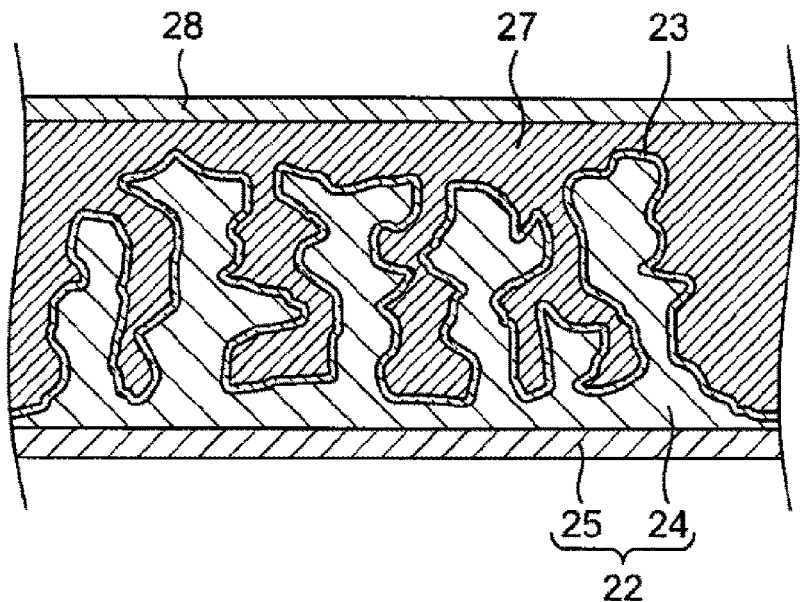
FIG. 3 schematically illustrates a cross section of a porous portion of the capacitor 21 in FIG. 2.

According to one aspect, the above capacitor may be a capacitor 21 illustrated in FIGS. 2 and 3. FIG. 2 illustrates a schematic cross-sectional view of the capacitor 21. FIG. 3 schematically illustrates an enlarged view of a high porosity portion of the capacitor 21. As illustrated in FIGS. 2 and 3, the capacitor 21 schematically includes a conductive porous base 22, a dielectric layer 23 which is formed on the conductive porous base 22 and an upper electrode 27 which is formed on the dielectric layer 23. The conductive porous base 22 includes a high porosity portion 24 on one primary surface side. The high porosity portion 24 is located at a center portion of the upper primary surface (a primary surface on an upper side in the drawings) of the conductive porous base 22. The high porosity portion 24 has a so-called porous structure, i.e., is a porous portion. Furthermore, the conductive porous base 22 includes a support portion 25 on the other primary surface (lower primary surface: the primary surface on a lower side in the drawings) side. At an end portion of the capacitor 21, an insulation portion 26 which surrounds the high porosity portion 24 exists between the support portion 25 and the dielectric layer 23. The capacitor 21 includes a first capacitor electrode 28 on the upper electrode 27, and a second capacitor electrode 29 on the primary surface of the conductive porous base 22 on the side of the support portion 25. In the capacitor 21, the first capacitor electrode 28 and the upper electrode 27 are electrically connected. The second capacitor electrode 29 is electrically connected with a lower primary surface of the conductive porous base 22. The upper electrode 27 and the high porosity portion 24 of the conductive porous base 22 face each other with the dielectric layer 23 interposed therebetween. When the upper electrode 27 and the conductive porous base 22 are electrified, electric charges can be accumulated in the dielectric layer 23.

The capacitor 21 includes capacitor electrodes on an upper primary surface and a lower primary surface of the capacitor, and can make electrode areas large. Therefore, when embedded in the rewiring layer, the capacitor 21 makes it easy to form electric connection between the vias and the wires and therefore is advantageous. Furthermore, the capacitor 21 is advantageous from a viewpoint to achieve a lower profile.

Figure 4:
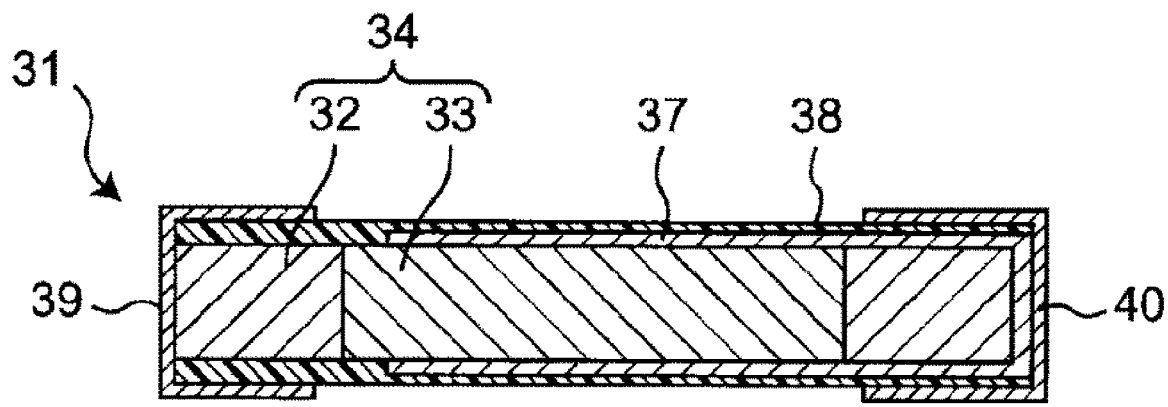
FIG. 4 is a schematic cross-sectional view of a capacitor 31 used in the wafer level package according to the present invention.
Figure 5:
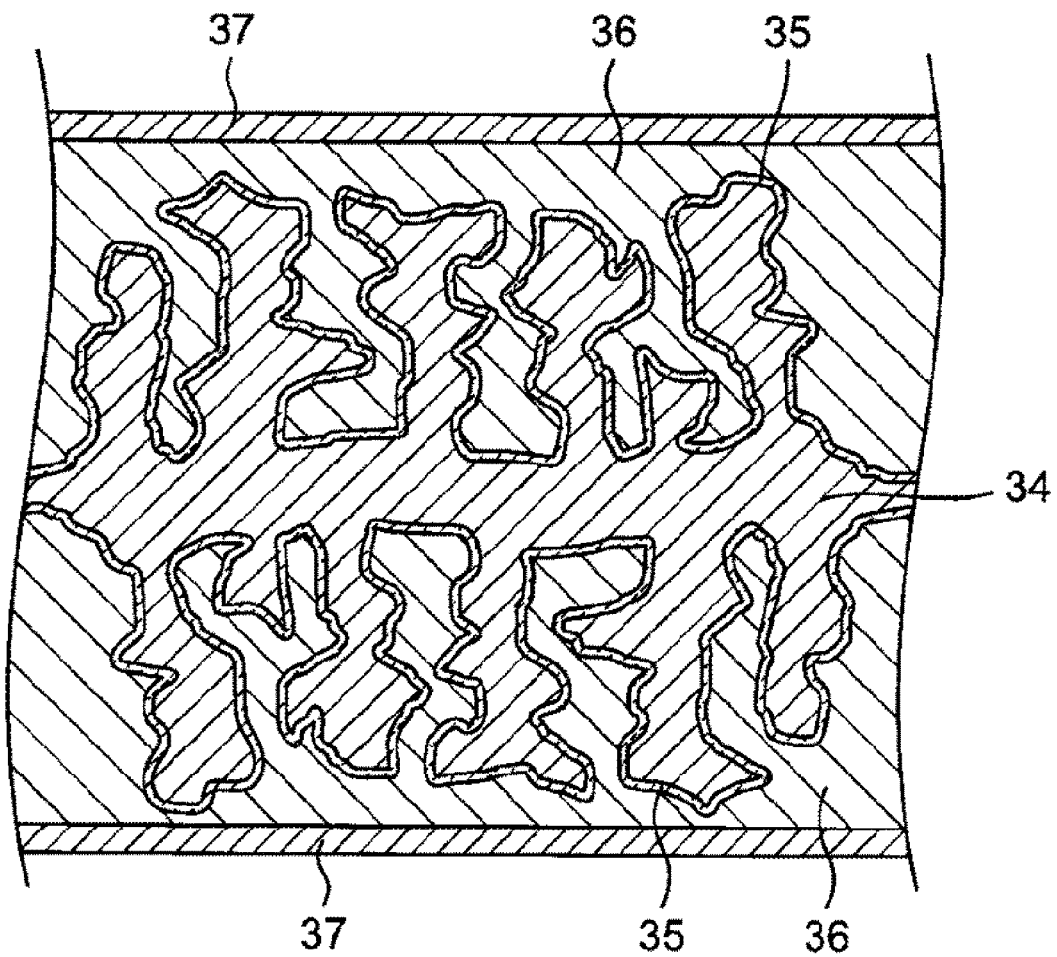
FIG. 5 schematically illustrates a cross section of a porous portion of the capacitor 31 in FIG. 4.

According to another aspect, the above capacitor may be a capacitor 31 illustrated in FIGS. 4 and 5. FIG. 4 is a schematic cross-sectional view of the capacitor 31 (in this regard, a dielectric layer 35 and an upper electrode 36 are not illustrated for ease of description). FIG. 5 schematically illustrates an enlarged view of a high porosity portion of the capacitor 31. As illustrated in FIGS. 4 and 5, the capacitor 31 has a substantially rectangular parallelepiped shape. The capacitor 31 schematically includes a conductive porous base 34 which includes a high porosity portion 33 at a center portion and a low porosity portion 32 at a side portion, the dielectric layer 35 which is formed on the conductive porous base 34, the upper electrode 36 which is formed on the dielectric layer 35, a wiring electrode 37 which is formed on the upper electrode 36 to be electrically connected with the upper electrode 36, and a protection layer 38 which is formed on the wiring electrode 37. A first capacitor electrode 39 and a second capacitor electrode 40 are provided on side surfaces of the conductive porous base 34 to face each other. The first capacitor electrode 39 is electrically connected with the conductive porous base 34. The second capacitor electrode 40 is electrically connected with the upper electrode 36 through the wiring electrode 37. The upper electrode 36 and the high porosity portion 33 of the conductive porous base 34 face each other with the dielectric layer 35 interposed therebetween. When the conductive porous base 34 and the upper electrode 36 are electrified through the first capacitor electrode 39 and the second capacitor electrode 40, electric charges can be accumulated in the dielectric layer 35.

These capacitors can include porous portions (high porosity portions) on the both primary surfaces of the conductive porous bases as illustrated in FIG. 5, and can obtain a higher capacitance.

The capacitor 31 includes capacitor electrodes on the left and the right. Consequently, when embedded in the rewiring layer, the capacitor electrodes can be arranged vertically, i.e., the first capacitor electrode 39 can be arranged facing toward the IC chip and the second capacitor electrode 40 can be arranged facing toward the connection pads.

The conductive porous base has a porous structure and, as long as a surface has conductivity, a material and a composition of the conductive porous base are not limited. Examples of the conductive porous base include a porous metal substrate and a substrate obtained by forming a conductive layer on a surface of a porous silica material, a porous carbon material or a porous ceramic sintered body. According to a preferred aspect, the conductive porous base is a porous metal substrate.

A metal for constituting the porous metal substrate is, for example, a metal such as aluminum, tantalum, nickel, copper, titanium, niobium and iron, and an alloy such as stainless steel and duralumin. The porous metal substrate is preferably an aluminum porous substrate.

The conductive porous base includes the high porosity portion (i.e., a porous portion), and may further include the low porosity portion and/or the support portion.

In this description, the "porosity" refers to a rate of cavities in the conductive porous base. The porosity can be measured as follows. In addition, the cavity of the porous portion is filled finally by the dielectric layer and the upper electrode in a process of making the capacitors. The above "porosity" is calculated with regarding the filled portion as a cavity, without considering substances filled in this way.

First, the porous metal substrate is treated by a focused ion beam (FIB) microsampling method and machined to a thin sample having a thickness equal to or less than 60 nm. A predetermined region (3 μm×3 μm) of this thin sample is measured by scanning transmission electron microscope (STEM)-energy dispersive X-ray spectrometry (EDS) mapping analysis. In a mapping measurement field of view, an area containing the metal of the porous metal substrate is calculated. Furthermore, the porosity can be calculated according to the following equation. This measurement is performed at three optional portions, and an average value of measurement values is the porosity.

$$\text{Porosity (\%)} = ((\text{measurement area} - \text{area containing metal of substrate})/\text{measured area}) \times 100$$

In this description, the "high porosity portion" means a portion having a higher porosity than the support portion and the low porosity portion of the conductive porous base.

The high porosity portion has a porous structure. The high porosity portion having the porous structure makes a specific surface area of the conductive porous base large, and makes a capacitance of the capacitor higher.

From a viewpoint of increasing a specific surface area and further increasing the capacitance of the capacitor, the porosity of the high porosity portion may be preferably 20% or more, more preferably 30% or more and still more preferably 35% or more. Furthermore, from a viewpoint of securing mechanical strength, the porosity is preferably 90% or less and is more preferably 80% or less.

The high porosity portion is not limited in particular, and preferably has an area increasing rate of 30 times or more and 10,000 times or less, more preferably 50 times or more and 5,000 times or less and, for example, 200 times or more and 600 times or less. In this regard, the area increasing rate means a surface area per unit projection area. The surface area per unit projection area can be calculated from a suction amount of nitrogen at a liquid nitrogen temperature by using a BET specific surface area measurement device.

Furthermore, the area increasing rate can be calculated by the following method, too. A scanning transmission electron microscope (STEM) image of a cross section of the above sample (the cross section obtained by cutting the sample in a thickness direction) having a width X in an entire thickness (height) T direction is captured (when the cross section cannot be captured at a time, a plurality of images may be connected). A total path length L of a pore surface of the obtained cross section having the width X and the height T (a total length of the pore surface) is measured. In this regard, the total path length of the pore surface in a regular quadrangular prism region whose one side surface is the cross section having the width X and the height T and whose bottom surface is a porous substrate surface is LX. Furthermore, a bottom area of this regular quadrangular prism is $X^2$. Consequently, the area increasing rate can be calculated as $LX/X^2=L/X$.

In this description, the "low porosity portion" means a portion of a low porosity compared to the high porosity portion. Preferably, the porosity of the low porosity portion is preferably lower than the porosity of the high porosity portion and is the porosity of the support portion or more.

The porosity of the low porosity portion is preferably 20% or less and more preferably 10% or less. Furthermore, the porosity of the low porosity portion may be 0%. That is, the low porosity portion may include or may not include a porous structure. As the porosity of the low porosity portion is lower, the mechanical strength of the capacitor improves more.

In addition, the low porosity portion is not an indispensable component, and may not exist as illustrated in the capacitor 21.

According to the present invention, positions of existence, the installation number, sizes, shapes and a ratio of the high porosity portions and the low porosity portions of the conductive porous base are not limited in particular. For example, one primary surface of the conductive porous base may include only the high porosity portion. Furthermore, by adjusting the ratio of the high porosity portion and the low porosity portion, it is possible to control the capacitance of the capacitor.

The thickness of the high porosity portion is not limited in particular and can be optionally selected to meet an object. The thickness of the high porosity portion may be, for example, 10 μm or more and 1000 μm or less, preferably 30 μm or more and 300 μm or less, preferably 150 μm or less, more preferably 80 μm or less and still more preferably 40 μm or less.

The porosity of the support portion of the conductive porous base is preferably low to exhibit a function of a support, is specifically 10% or less. More preferably, the support portion does not substantially include a cavity.

The thickness of the support portion is not limited in particular, and is preferably 10 μm or more and is, for example, 100 μm or more or 500 μm or more to enhance the mechanical strength of the capacitor. Furthermore, from a viewpoint of achieving a lower profile of the capacitor, the thickness of the support portion is preferably 1000 μm or less, is, for example, 500 μm or less, is preferably 100 μm or less, is more preferably 50 μm or less and is still more preferably 30 μm or less.

The thickness of the conductive porous base is not limited in particular and can be optionally selected to meet an object. The thickness of the conductive porous base is, for example, 200 μm or less, is preferably 80 μm or less, is more preferably 40 μm and has a lower limit of preferably 30 μm or more.

A method for manufacturing the conductive porous base is not limited in particular. For example, the conductive porous base can be manufactured by a method for forming a porous structure with an appropriate metal material, a method for crushing (burying) the porous structure, a method for removing a porous structure portion or a combination of these methods.

The metal material for manufacturing the conductive porous base may be a porous metal material (e.g., etched foil), a metal material (e.g., metal foil) without the porous structure or a material obtained by combining these materials. A combining method is not limited in particular, and is, for example, a method for pasting the material by welding or a conductive adhesive.

The porous structure forming method is not limited in particular, and is preferably etching processing such as direct current or alternating current etching processing.

The porous structure crushing (burying) method is not limited in particular, and is, for example, a method for melting a metal by laser irradiation or the like and crushing holes or a method for compressing and crushing the holes by mold machining or press working. The above laser is not limited in particular, and is a $CO_2$ laser, a YAG laser, an excimer laser or an all solid pulse laser such as a femtosecond laser, a picosecond laser or a nanosecond laser. The all solid pulse laser such as the femtosecond laser, the picosecond laser or the nanosecond laser is preferable since the all solid pulse laser can control the shape and the porosity more precisely.

The porous structure portion removing method is not limited in particular, and is, for example, dicer machining or laser ablation machining.

According to one method, the conductive porous base can be manufactured by preparing a porous metal material, and crushing (burying) holes at portions corresponding to the support portion and the low porosity portion of this porous metal substrate.

The support portion and the low porosity portion do not need to be simultaneously formed, and may be separately formed. For example, the portion corresponding to the support portion of the porous metal substrate may be first processed to form the support portion. Then, the portion corresponding to the low porosity portion may be processed to form the low porosity portion.

According to another method, the conductive porous base can be manufactured by processing a portion corresponding to the high porosity portion of the metal substrate (e.g., metal foil) without the porous structure, and forming the porous structure.

According to still another method, the conductive porous base without the low porosity portion can be manufactured by crushing the hole at the portion corresponding to the support portion of the porous metal material and then removing the portion corresponding to the low porosity portion.

The dielectric layer is formed above the high porosity portion in the capacitor used in the present invention.

The material for forming the dielectric layer is not limited in particular as long as the material has an insulation property. This material is preferably a metal oxide such as $AlO_x$ (e.g., $Al_2O_3$), $SiO_x$ (e.g., $SiO_2$), $AlTiO_x$, $SiTiO_x$, $HfO_x$, $TaO_x$, $ZrO_x$, $HfSiO_x$, $ZrSiO_x$, $TiZrO_x$, $TiZrWO_x$, $TiO_x$, $SrTiO_x$, $PbTiO_x$, $BaTiO_x$, $BaSrTiO_x$, $BaCaTiO_x$ and $SiAlO_x$; a metal nitride such as $AlN_x$, $SiN_x$ and $AlScN_x$; or a metal oxynitride such as $AlO_xN_y$, $SiO_xN_y$, $HfSiO_xN_y$ and $SiC_xO_yNz$. Especially, $AlO_x$, $SiO_x$, $SiO_xN_y$ and $HfSiO_x$ are preferable. In addition, the above chemical formulae simply express material compositions, and do not limit the compositions. That is, x, y and z assigned to O and N and the like may be any value larger than 0, and an abundance ratio of each element containing a metal element is optional.

The thickness of the dielectric layer is not limited in particular, and, for example, is preferably 5 nm or more and 100 nm or less and is more preferably 10 nm or more and 50 nm or less. The thickness of the dielectric layer is 5 nm or more, so that it is possible to enhance the insulation property and reduce a leakage current. Furthermore, by making the thickness of the dielectric layer 100 nm or less, it is possible to obtain a higher capacitance.

The above dielectric layer is preferably formed by a gas phase method such as a vacuum deposition method, a chemical vapor deposition (CVD) method, a spattering method, an atomic layer deposition (ALD) method or a pulsed laser deposition (PLD) method. The ALD method is more preferable since the ALD method can form a uniform and fine film in a pore fine portion of the porous member.

According to one aspect (e.g., in the capacitor 21), an insulation portion is provided at an end portion of the dielectric layer. By installing the insulation portion, it is possible to prevent short-circuiting between the upper electrode installed on the insulation portion and the conductive porous base.

In the capacitor 21, the insulation portion is located between the conductive porous base (support portion) and the dielectric layer, yet is not limited to this. The insulation portion only needs to be located between the conductive porous base and the upper electrode, and may be located between, for example, the dielectric layer and the upper electrode.

A material for forming the insulation portion is not limited in particular as long as the material has the insulation property. When the atomic layer deposition method is used later, this material is preferably a resin having heat resistance. An insulation material for forming the insulation portion is preferably various glass materials, a ceramic material, a polyimide resin or a fluorine resin. Furthermore, this material may include a filler such as an Si filler for adjusting a linear expansion coefficient.

The thickness of the insulation portion is not limited in particular, and is preferably 1 μm or more and is preferably, for example, 3 μm or more or 5 μm or more from a viewpoint of reliable prevention of end surface discharging. Furthermore, from a viewpoint of achieving a lower profile of the capacitor, the thickness of the insulation portion may be preferably 100 μm or less, for example, 50 μm or less, preferably 20 μm or less and more preferably 10 μm or less. In addition, the thickness of the insulation portion means the thickness of the insulation portion at the capacitor end portion.

The width of the insulation portion 26 is not limited in particular, and may be preferably 3 μm or more, more preferably 5 μm or more and still more preferably 10 μm or more from a viewpoint of, for example, suppression of occurrence of a crack at a capacitance formation portion or the insulation portion in the manufacturing process. Furthermore, from a viewpoint of further increasing the capacitance, the width of the insulation portion 26 may be preferably 100 μm or less and is more preferably 50 μm or less. In this regard, the width of the insulation portion means the width from the capacitor end portion to a center direction of the capacitor, that is, a maximum distance from the capacitor end portion to a portion which contacts the high porosity portion 24 in the cross-sectional view in FIG. 2, for example.

In addition, in the capacitor used for the present invention, the insulation portion is not an indispensable element, and may not need to exist.

The upper electrode is formed on the dielectric layer.

A material for constituting the upper electrode is not limited in particular as long as the material has conductivity. Examples of the material include Ni, Cu, Al, W, Ti, Ag, Au, Pt, Zn, Sn, Pb, Fe, Cr, Mo, Ru, Pd and Ta; alloys of these elements such as CuNi, AuNi and AuSn; metal nitrides and metal oxynitrides such as TiN, TiAlN, TiON, TiAlON and TaN; and conductive polymers (e.g., PEDOT (poly(3,4-ethylenedioxythiophene)), polypyrrole and polyaniline). Especially, TiN or TiON are preferable.

The thickness of the upper electrode is not limited in particular, and is preferably, for example, 3 nm or more and is more preferably 10 nm or more. By making the thickness of the upper electrode 3 nm or more, it is possible to reduce a resistance of the upper electrode.

The upper electrode may be formed by the ALD method. By using the ALD method, it is possible to further increase the capacitance of the capacitor. As another method, a chemical vapor deposition (CVD) method, plating, bias spattering, a Sol-Gel method or a method such as conductive polymer filling which can coat the dielectric layer and substantially bury pores of the porous metal substrate may be used to form the upper electrode. A conductive film may be preferably formed on the dielectric layer by the ALD method, and a conductive or preferably a substance of a lower electric resistance is filled in the pores by another method on the conductive film to form the upper electrode. According to this configuration, it is possible to efficiently obtain a higher capacitance density and a low equivalent series resistance (ESR).

In addition, when the upper electrode does not have sufficient conductivity as a capacitor electrode after the upper electrode is formed, an extended electrode layer made of Al, Cu, Ni or the like may be additionally formed on a surface of the upper electrode by a method such as spattering, deposition or plating.

According to one aspect, the first capacitor electrode may be formed to be electrically connected with the upper electrode, and the second capacitor electrode may be formed to be electrically connected with the conductive porous base.

A material for constituting the capacitor electrode is not limited in particular, is, for example, a metal such as Au, Pb, Pd, Ag, Sn, Ni or Cu, an alloy of these elements and a conductive polymer, and especially Cu is preferable. By using Cu for the capacitor electrode, it is possible to minimize deterioration of the capacitor electrode caused by laser processing for forming holes for forming vias in the insulation layer on the capacitor. The capacitor electrode forming method is not limited in particular. For example, the CVD method, electrolytic plating, electroless plating, deposition, spattering and conductive paste baking can be used for this method. Especially, electrolytic plating, electroless plating, deposition or spattering are preferable.

According to one aspect, there may be the solder plated layer or the metal nano grain layer on the capacitor electrode, and especially the solder plated layer is preferable. This solder plated layer or metal nano grain layer may be an outermost layer of the primary surface of the capacitor.

A solder material for constituting the solder plated layer is not limited in particular. The solder material is preferably a material containing tin, and is, for example, an SnAg-based, SnCu-based, SnSb-based or SnBi-based Pb free solder or a solder containing Pb such as Sn-37Pb. Particularly, the solder material containing tin has a low Young's modulus and contributes to improvement of durability of the capacitor.

The metal nano grain can be sintered at a very low temperature compared to a melting point of the material for constituting the metal nano grain, and can be used as the same bonding material as the solder.

A metal material for constituting the metal nano grain layer is not limited in particular, and is Cu, Ag, Pd, Au and Ni.

The grain diameter of the nano grain which constitutes the metal nano grain layer is, for example, D50 (a grain diameter at a point at which a cumulative value is 50% in a cumulative curve in a case where a particle size distribution is calculated based on a volume reference and an entire volume is 100%). The grain diameter may be 5 nm to 1 μm, preferably 10 nm to 300 nm, and more preferably 20 nm to 100 nm.

According to a preferred aspect, there may be the solder plated layer or the metal nano grain layer on one capacitor electrode, and the other capacitor electrode may be a copper electrode. According to this aspect, an outermost layer of the first primary surface of the capacitor is the solder plated layer or the metal nano grain layer, and an outermost layer of a second primary surface is the copper electrode.

According to the preferred aspect, the capacitor 4 is the capacitor 21.

According to a more preferable aspect, on the second capacitor electrode 29 of the capacitor 21, the solder plated layer or the metal nano grain layer exists as the outermost layer. Especially the solder plated layer is preferable, and the solder plated layer formed using a solder material containing tin is more preferable.

According to a still more preferable aspect, the first capacitor electrode 28 of the capacitor 21 is the copper electrode which is the outermost layer.

According to still another more preferable aspect, the first capacitor electrode 28 of the capacitor 21 is the copper electrode which is the outermost layer, and on the second capacitor electrode 29 the solder plated layer or the metal nano grain layer exists as the outermost layer. Especially the solder plated layer is preferable and the solder plated layer formed using a solder material containing tin is more preferable. When reassembled in the rewiring layer, this capacitor 21 is easily electrically connected with the wire or the via by reflow processing. Furthermore, when via holes are formed in the insulation layer disposed above the capacitor by, for example, laser processing, it is possible to minimize deterioration caused by oxidation of the capacitor electrodes and the like.

Furthermore, the capacitor used for the present invention is not limited to the illustrated aspects, and can be variously modified.

For example, the capacitor can have any shape, and may have a planar shape which is a circular shape, an elliptical shape or a square shape whose corners are round.

Furthermore, a layer for enhancing adhesion between the layers or a buffer layer for preventing diffusion of components between the layers may be provided between the layers. Furthermore, a protection layer may be provided on a side surface of the capacitor.

In addition, there are two capacitors in the illustrated wafer level package. However, the number of capacitors is not limited to this, as long as the number is one or more and may be, for example, one, three, four or five. Furthermore, the capacitors do not need to exist in the same insulation layer and may exist in different layers.

The wafer level package according to the present invention includes the capacitors embedded in the rewiring layer. Consequently, wire lengths are shorter compared to a case where a wafer level package and capacitors are separately mounted on a circuit board. Therefore, the wafer level package has good electric characteristics such as a low parasitic inductance. Furthermore, a region for mounting the capacitors on the circuit board is unnecessary, so that the circuit board can be effectively used, and is suitable for miniaturization, too. Particularly, the wafer level package 1a according to the present embodiment is advantageous from a viewpoint of miniaturization since the rewiring layer including the embedded capacitors is accommodated in the upper region of the IC chip.

Next, a method for manufacturing the Fan-In type wafer level package 1a will be described.

Figure 6A:
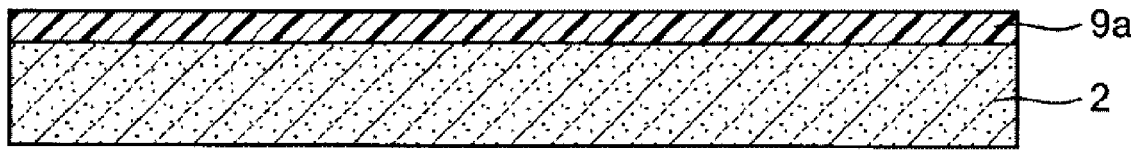
FIGS. 6A-6G are views for explaining a method for manufacturing the wafer level package 1a illustrated in FIG. 1.

First, the IC chip 2 is prepared, and an insulation layer 9a is formed on an upper primary surface of the IC chip 2 (FIG. 6A). FIGS. 6A-6G illustrate only one IC chip. However, the IC chip is generally processed as a collective board including plurality of IC chips, and is finally cut to obtain each wafer level package. For example, the IC chip can be processed as a wafer whose diameter is 200 mm, 300 mm or 450 mm.

An insulation layer forming method is not limited in particular, and can be formed by, for example, coating a resin and then curing the resin. As a resin coating method, spin coating, dispenser coating, spray coating, screen printing or the like can be used. Furthermore, the insulation layer may be formed by pasting an additionally formed insulation sheet.

Figure 6B:
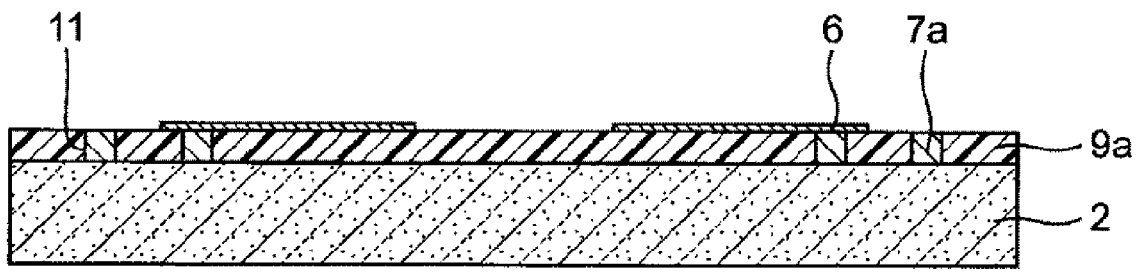

Next, the via holes 11 are formed in the insulation layer 9a to expose the electrodes of the IC chip 2. Next, a conductive metal is filled in the via holes 11 to form vias 7a and further form the wires 6 on the insulation layer 9a (FIG. 6B).

A method for forming the via holes 11 is not limited in particular, and laser processing or photovia processing can be used and especially the photovia processing is preferable.

A via and wire forming method is not limited in particular, and, for example, electrolytic plating, electroless plating, the CVD method, deposition, spattering, conductive paste baking, screen printing or the like can be used. Electrolytic plating or electroless plating reliably enables electric connection among the electrodes of the IC chip, the vias and the wires, and therefore is preferable.

Furthermore, according to another method, the insulation layer may be additionally formed to be pasted to the IC chip, then the vias and the wires may be formed, or the insulation sheet including the vias and the wires may be formed and pasted to the IC chip.

Figure 6C:
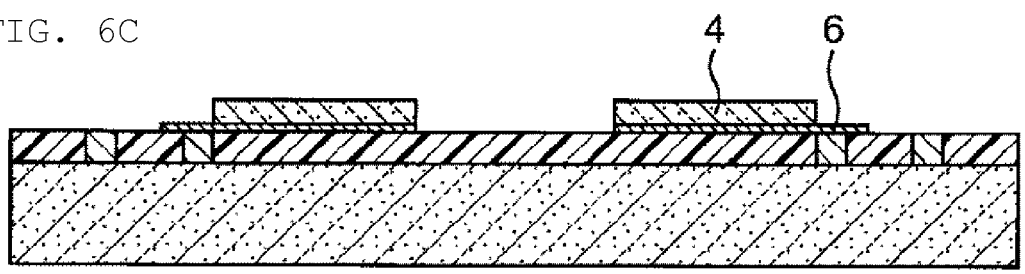

Next, fluxes (not illustrated) are coated on the wires 6, and the capacitors 4 including the solder plated layers on the lower surfaces are disposed on the fluxes. By coating the fluxes, it is possible to temporarily fix the capacitors 4 and easily solder-bond the capacitors 4 and the wires 6. Next, reflow processing is performed on a substrate to which the capacitors 4 have been temporarily fixed to connect the capacitors onto the wires (FIG. 6C).

The fluxes are not limited in particular as long as the fluxes are fluxes for soldering, and rosin fluxes are preferably used. Coating of the fluxes is not limited in particular, and is performed by using a dispenser, screen printing, an inkjet, or the like.

In addition, a method for connecting the capacitors to the wires is not limited to the above method, and may be another method such as a method which uses a conductive adhesive, welding, pressure bonding or the like.

Figure 6D:
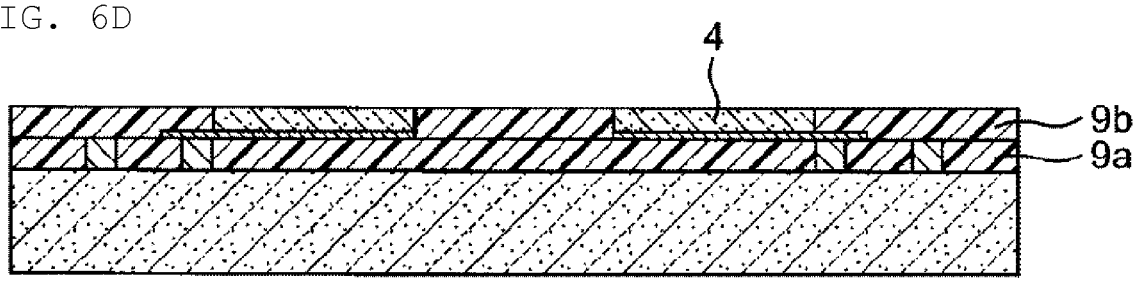
Figure 6E:
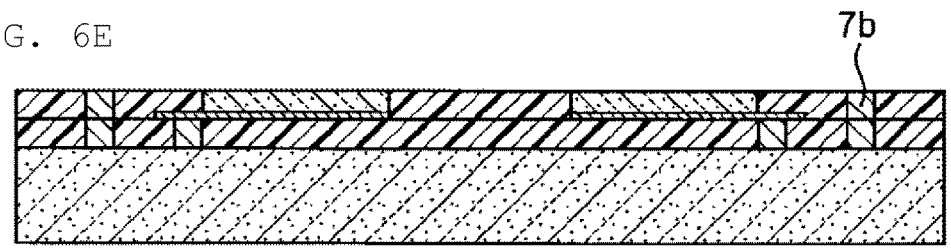

Next, an insulation layer 9b having the same thickness as the thicknesses of the capacitors 4 is formed on the insulation layer 9a (FIG. 6D). Next, the via holes are formed at predetermined portions, and a conductive metal is filled in the via holes to form vias 7b (FIG. 6E).

Figure 6F:
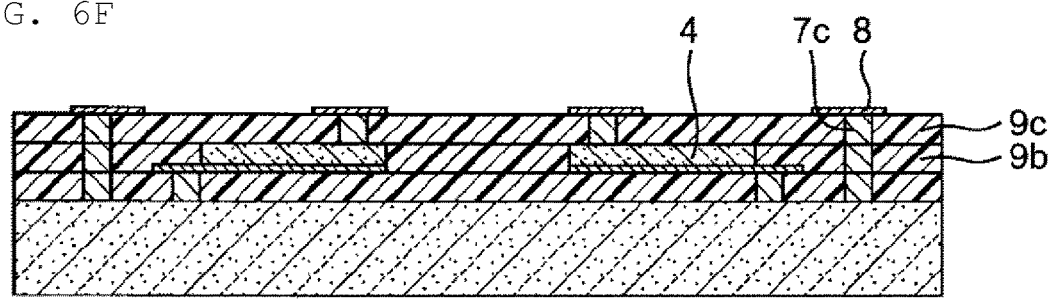

Next, an insulation layer 9c is formed on the insulation layer 9b, the via holes are formed at the predetermined portions and the conductive metal is filled in the via holes to form vias 7c. In this regard, some of the vias 7c are electrically connected with the capacitor electrodes of the capacitors 4. Next, the connection pads 8 are formed on the vias 7c exposed from the insulation layer 9c (FIG. 6F).

A connection pad forming method is not limited in particular, and the connection pads can be formed by the same method as that for forming the wires.

In addition, according to the illustrated aspects, the connection pads are directly connected to the vias. However, the connection are not limited to this, and may be connected to the vias through the wires. In this case, the wires and the vias are preferably formed integrally.

Figure 6G:
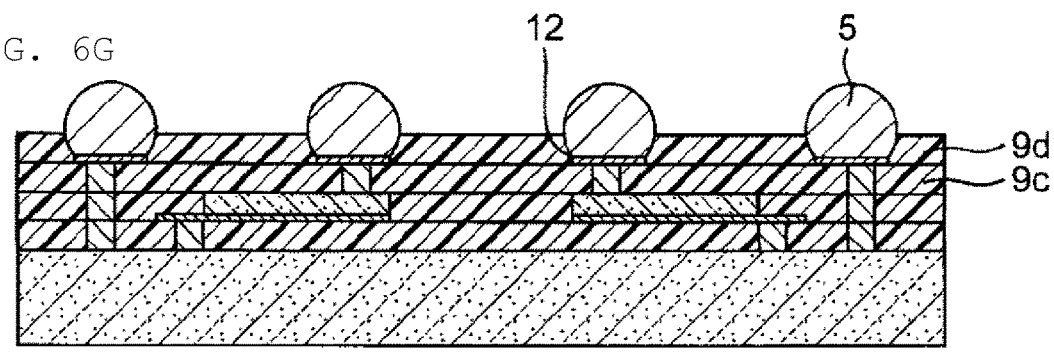

Next, an insulation layer 9d is formed on the insulation layer 9c, and the through-holes 12 are formed at portions corresponding to the connection pads 8. Next, the solder balls 5 are formed on the exposed connection pads 8 (FIG. 6G).

Generally, the above wafer level package can be obtained as a collective board. The collective board can be divided into each element assembly by using a dicing blade, various laser devices, a dicer, various blades, a mold and the like.

Second Embodiment

Figure 7:
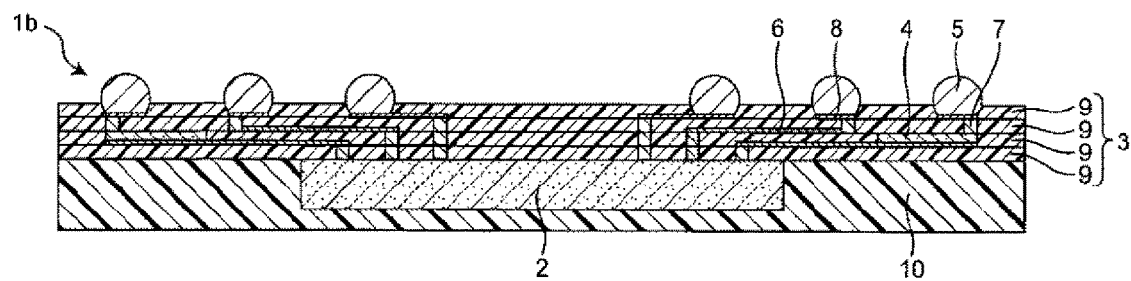
FIG. 7 is a schematic cross-sectional of a wafer level package 1b according to another embodiment of the present invention.

FIG. 7 is a schematic cross-sectional view of a wafer level package 1b according to another embodiment of the present invention. As illustrated in FIG. 7, the wafer level package 1b according to the present embodiment schematically includes an IC chip 2, a support portion 10 which is located on a lateral side to the IC chip 2, a rewiring layer 3 which is provided on the IC chip 2 and the support portion 10, capacitors 4 which are embedded in the rewiring layer 3, and solder balls 5 which are provided on the rewiring layer 3. The rewiring layer 3 includes wires 6, vias 7 and connection pads 8. Electrodes of the IC chip 2 are electrically connected with the solder balls 5 through the wires 6, the vias 7 and the connection pads 8 (partially through the capacitors 4, too) provided in the rewiring layer 3.

The wafer level package 1b according to the second embodiment differs from a wafer level package 1a according to the first embodiment in that the IC chip 2 except its upper primary surface is covered by the support portion 10, and the rewiring layer 3 is also provided on the surrounding support portion 10 beyond an upper space of the upper primary surface of the IC chip 2.

The support portion 10 is preferably formed such that one surface of the support portion is formed coplanarly with the upper primary surface of the IC chip 2. In addition, in the illustrated wafer level package 1b, the support portion is provided covering the IC chip 2, yet is not limited to this. For example, according to one aspect, the support portion may be provided such that a lower primary surface of the IC chip 2 is exposed. In this case, the thickness of the support portion is preferably substantially the same as the thickness of the IC chip. According to another aspect, the support portion may be provided only on one side surface, two side surfaces or three side surfaces of the IC chip.

The length from the edge of the support portion 10 to the edge of the IC chip 2 can be optionally determined according to a desired rewiring mode, and is, for example, 100 μm or more and 5.0 mm or less and is preferably 200 or more and 2.0 mm or less.

A material for constituting the support portion 10 is not limited in particular as long as this material is an insulation material. For example, a resin or ceramics can be used for this material. This material is preferably a resin and more preferably a heat resistant resin and specifically polyimide, polybenzoxazole, polyethylene terephthalate, a benzocyclobutene resin or an epoxy resin. Furthermore, this material may include a filler such as an Si filler for adjusting a linear expansion coefficient. According to a preferred embodiment, the material for constituting the support portion 10 is the same as a material for forming an insulation layer of the rewiring layer 3.

Except that the rewiring layer 3 is provided beyond an edge portion of the IC chip and extending to an upper side of the support portion, the rewiring layer 3 employs substantially the same configuration as a rewiring layer according to the first embodiment.

The other components, i.e., the IC chip 2, the capacitors 4 and the solder balls 5 employ substantially the same configurations as those of the IC chip, the capacitors and the solder balls 5 according to the first embodiment.

The wafer level package 1b according to the present embodiment can effectively use a circuit board for mounting, and is advantageous for miniaturization, too. In addition, a size of the rewiring layer can be freely designed. Consequently, the wafer level package 1b can support multipin IC chips such as IC chips including 300 pins or more and therefore is advantageous. Furthermore, even when IC chips of different dimensions are used, it is possible to obtain wafer level packages of the same size. Consequently, the wafer level package 1b is advantageous from a viewpoint of standardization of the dimensions.

Next, a method for manufacturing the Fan-Out type wafer level package 1b will be described.

Figure 8A:
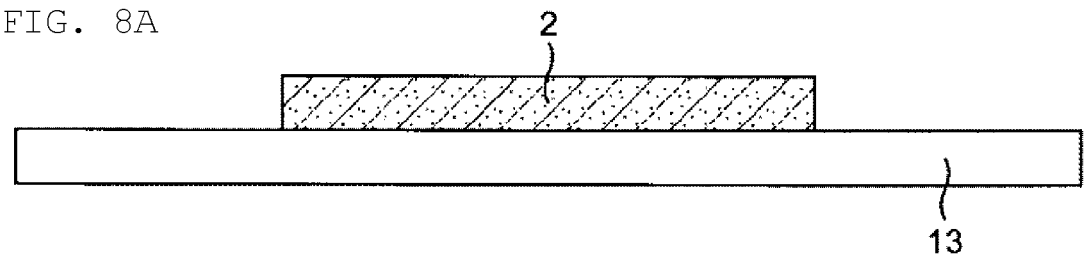
FIGS. 8A-8J are views for explaining a method for manufacturing the wafer level package 1b illustrated in FIG. 7.

First, the IC chip 2 is prepared, and disposed with an upper primary surface (circuit surface) facing below on a carrier 13 (FIG. 8A). In this case, the IC chip 2 is individually cut with a dicing machine, and disposed on the carrier 13. FIGS. 8A-8J illustrates only one IC chip 2 on the carrier 13. Generally, a plurality of IC chips is aligned and disposed on the carrier 13, and is cut to each wafer level package at last stage of manufacturing.

Figure 8B:
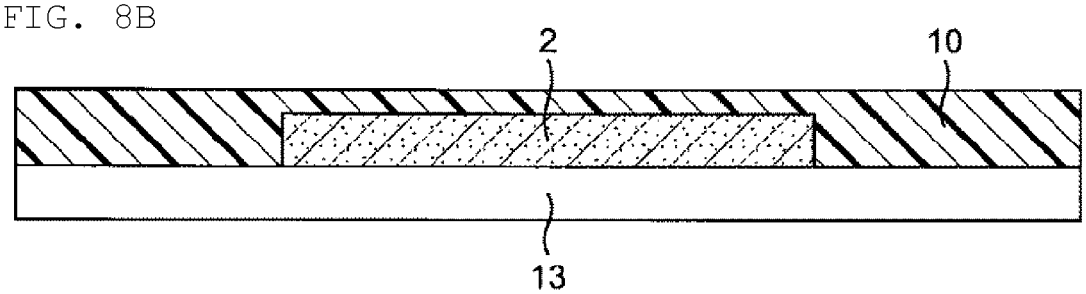

Next, the support portion 10 is formed on the carrier 13 and the IC chip 2 covering the IC chip 2 (FIG. 8B).

The support portion is not limited in particular, and can be formed by, for example, coating a resin and then curing the resin. A resin coating method is not limited in particular, and spin coating, dispenser coating, spray coating, screen printing or the like can be used.

Figure 8C:
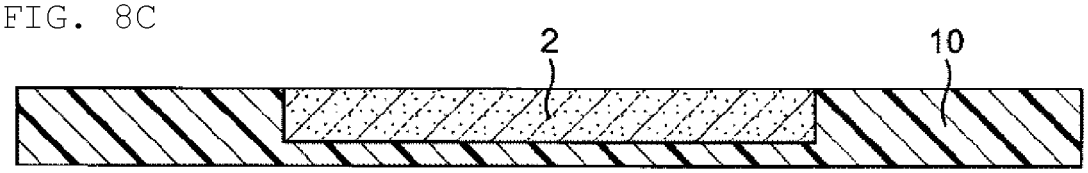

Next, the carrier 13 is peeled (FIG. 8C). In FIG. 8C, the carrier 13 is peeled, and then the entire package is reversed upside down.

Figure 8D:
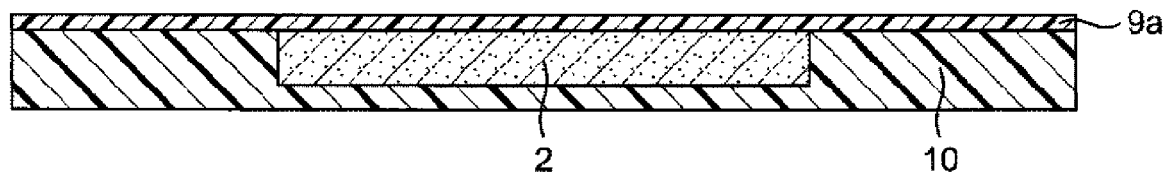

Next, an insulation layer 9a is formed on the IC chip 2 and the carrier 13 (FIG. 8D).

An insulation layer forming method is not limited in particular, and can be formed by, for example, coating a resin and then curing the resin. As a resin coating method, spin coating, dispenser coating, spray coating, screen printing or the like can be used. Furthermore, the insulation layer may be formed by pasting an additionally formed insulation sheet.

Figure 8E:
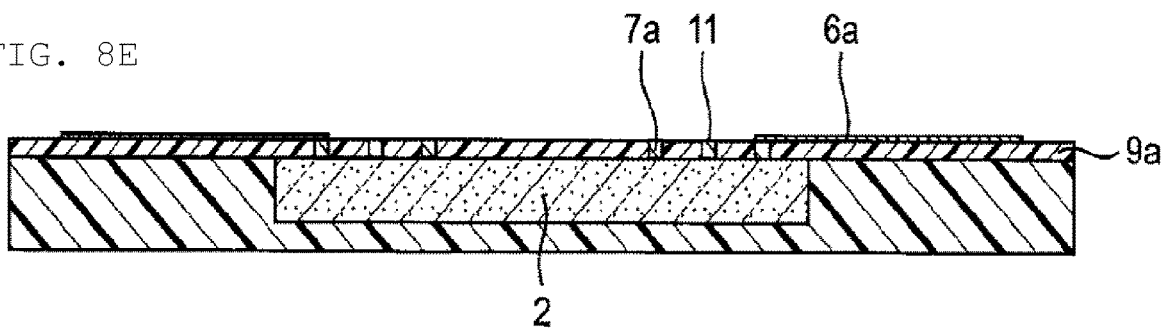

Next, via holes 11 are formed in the insulation layer 9a to expose electrodes of the IC chip 2. Next, a conductive metal is filled in the via holes 11 to form vias 7a and further form wires 6a on the insulation layer 9a (FIG. 8E).

A method for forming the via holes 11, the vias and the wires is the same as the via and wire forming method for the wafer level package 1a according to the first embodiment.

Figure 8F:
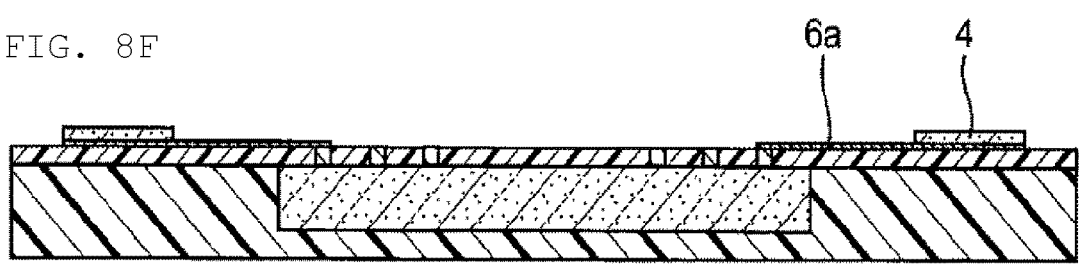

Next, fluxes (not illustrated) are coated on the wires 6a, and the capacitors 4 including the solder plated layers on the lower surfaces are disposed on the fluxes. Next, reflow processing is performed on a substrate to which the capacitors 4 have been temporarily fixed to connect the capacitors onto the wires (FIG. 8F).

A flux type and a flux coating method are the same as the type and the coating method for the wafer level package 1a according to the first embodiment.

Figure 8G:
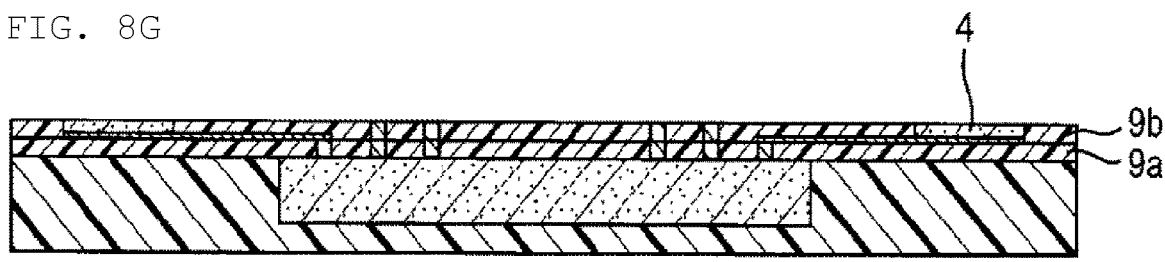

Next, an insulation layer 9b having the same thickness as the thicknesses of the capacitors 4 is formed on the insulation layer 9a (FIG. 8G).

Figure 8H:
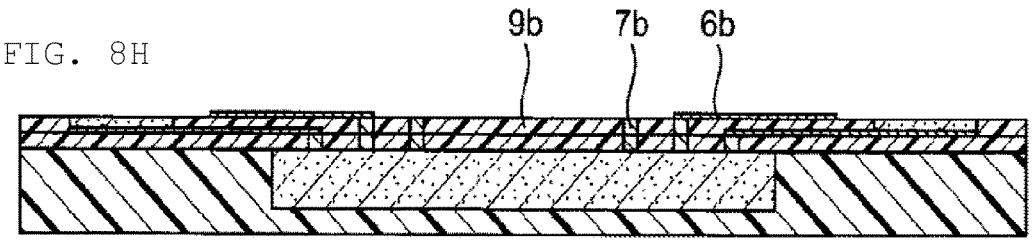

Next, the via holes are formed at predetermined portions, a conductive metal is filled in the via holes to form vias 7b, and wires 6b are provided in the insulation layer 9b (FIG. 8H).

Figure 8I:
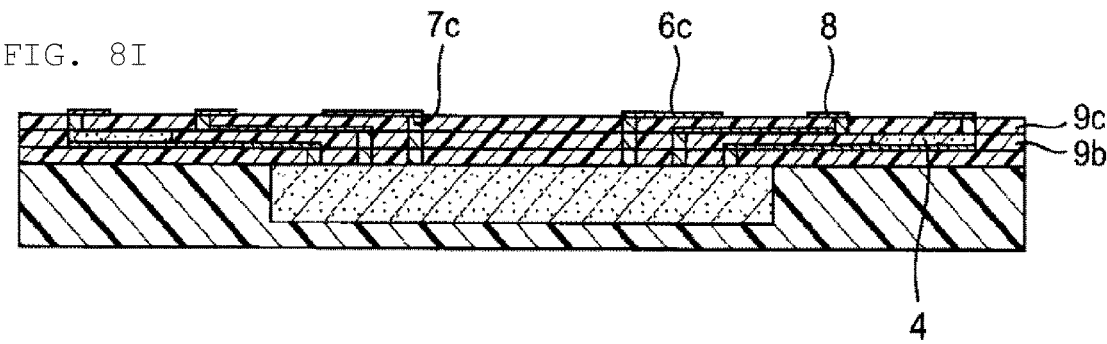

Next, an insulation layer 9c is formed on the insulation layer 9b, and vias 7c, wires 6c and the connection pads 8 are formed at predetermined portions (FIG. 8I). In this regard, some of the vias 7c are electrically connected with the capacitor electrodes of the capacitors 4.

A connection pad forming method is not limited in particular, and the connection pads can be formed by the same method as that for forming the wires.

Figure 8J:
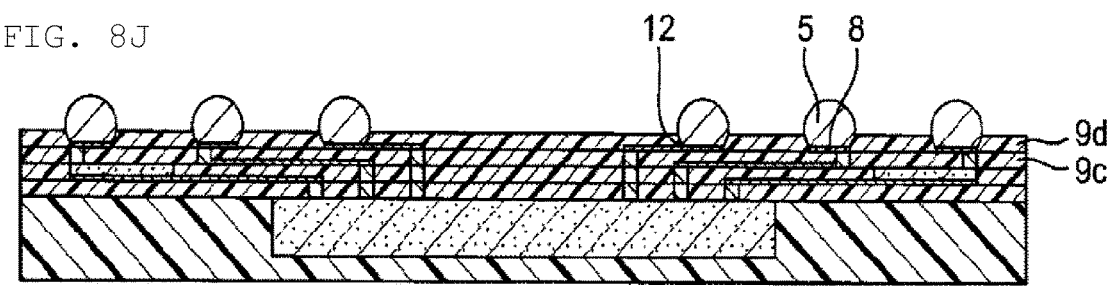
Figure 8J:
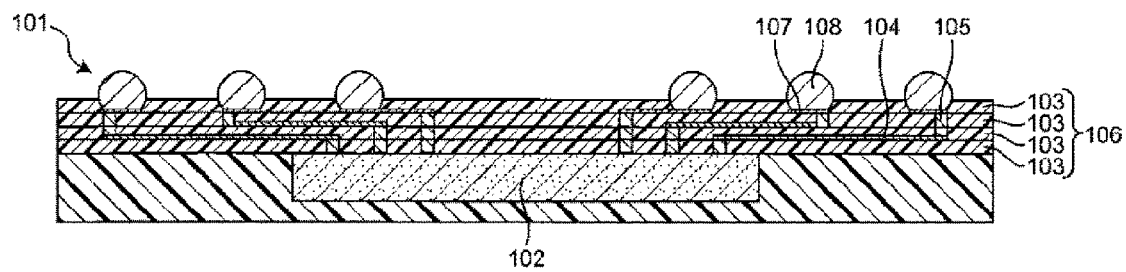

Next, an insulation layer 9d is formed on the insulation layer 9c, and through-holes 12 are formed at portions corresponding to the connection pads 8. Next, the solder balls 5 are formed on the exposed connection pads 8 (FIG. 8J).

Generally, the above wafer level package can be obtained as a collective board. The collective board can be divided into each element assembly by using a dicing blade, various laser devices, a dicer, various blades, a mold and the like.

The wafer level package according to the present invention has been described above. However, the wafer level package according to the present invention is not limited to the illustrated aspects, and can be variously modified.

The wafer level package according to the present invention has a short wire length between the IC chip and the capacitors and good electric property, and consequently can be suitably applied to various high frequency circuits.

DESCRIPTION OF REFERENCE SYMBOLS 1a, 1b: WAFER LEVEL PACKAGE
2: IC CHIP
3: REWIRING LAYER
4: CAPACITOR
5: SOLDER BALL
6: WIRING
7a, 7b: VIA
8: CONNECTION PAD
9: INSULATION LAYER
9a, 9b, 9c, 9d: INSULATION LAYER
10: SUPPORT PORTION
11: VIA HOLE
12: THROUGH-HOLE
13: CARRIER
21: CAPACITOR
22: CONDUCTIVE POROUS BASE
23: DIELECTRIC LAYER
24: HIGH POROSITY PORTION
25: SUPPORT PORTION
26: INSULATION PORTION
27: UPPER ELECTRODE
28: FIRST CAPACITOR ELECTRODE
29: SECOND CAPACITOR ELECTRODE
31: CAPACITOR
32: LOW POROSITY PORTION
33: HIGH POROSITY PORTION
34: CONDUCTIVE POROUS BASE
35: DIELECTRIC LAYER
36: UPPER ELECTRODE
37: WIRING ELECTRODE
38: PROTECTION LAYER
39: FIRST CAPACITOR ELECTRODE
40: SECOND CAPACITOR ELECTRODE
101: WAFER LEVEL PACKAGE
102: IC CHIP
103: RESIN LAYER
104: WIRING
105: VIA
106: REWIRING LAYER
107: CONNECTION PAD
108: SOLDER BALL
111: CIRCUIT BOARD
112: CAPACITOR CHIP
113: WIRING

The invention claimed is:

1. A wafer level package comprising:
   an IC chip;
   a rewiring layer on the IC chip; and
   a capacitor which is embedded in the rewiring layer, wherein
   a first outermost layer of a first primary surface of the capacitor is a solder plated layer or a metal nano grain layer, and
   a second outermost layer of a second primary surface of the capacitor is a copper layer.

2. The wafer level package according to claim 1, wherein the rewiring layer is in an upper region of the IC chip.

3. The wafer level package according to claim 1, further comprising a support portion located on at least a lateral side of the IC chip, wherein the rewiring layer is provided beyond an edge portion of the IC chip and extends over the support portion.

4. The wafer level package according to claim 3, further comprising a solder ball on the rewiring layer.

5. The wafer level package according to claim 3, wherein the capacitor includes a conductive porous base, a dielectric layer on the conductive porous base, and an upper electrode on the dielectric layer.

6. The wafer level package according to claim 1, wherein the first outermost layer of the first primary surface of the capacitor is the solder plated layer, and the solder plated layer contains tin.

7. The wafer level package according to claim 3, wherein the capacitor comprises:
   a conductive porous base having a high porosity portion at a center portion thereof and a low porosity portion at a side portion thereof;
   a dielectric layer on the conductive porous base;
   an upper electrode on the dielectric layer;
   a wiring electrode on the upper electrode;
   a first capacitor electrode on a first side surface of the conductive porous base and electrically connected to the conductive porous base; and
   a second capacitor electrode on a second side surface of the conductive porous base opposite to the first side surface and electrically connected to the upper electrode via the wiring electrode.

8. The wafer level package according to claim 1, further comprising a solder ball on the rewiring layer.

9. The wafer level package according to claim 1, wherein the capacitor includes a conductive porous base, a dielectric layer on the conductive porous base, and an upper electrode on the dielectric layer.

10. The wafer level package according to claim 1, wherein the capacitor comprises:

a conductive porous base having a high porosity portion at a center portion thereof and a low porosity portion at a side portion thereof;

a dielectric layer on the conductive porous base;

an upper electrode on the dielectric layer;

a wiring electrode on the upper electrode;

a first capacitor electrode on a first side surface of the conductive porous base and electrically connected to the conductive porous base; and a second capacitor electrode on a second side surface of the conductive porous base opposite to the first side surface and electrically connected to the upper electrode via the wiring electrode.

11. An electronic device comprising:

a circuit board; and the wafer level package according to claim 1 mounted on the circuit board.

12. A capacitor comprising:

a conductive porous base;

a dielectric layer on the conductive porous base; and an upper electrode on the dielectric layer, wherein an outermost layer of at least a first primary surface of the capacitor is a solder plated layer or a metal nano grain layer, and a second outermost layer of a second primary surface of the capacitor is a copper layer.

13. The capacitor according to claim 12, wherein the conductive porous base includes a high porosity portion at a center portion thereof and a low porosity portion at a side portion thereof, and the capacitor further comprises:

a wiring electrode on the upper electrode;

a first capacitor electrode on a first side surface of the conductive porous base and electrically connected to the conductive porous base; and a second capacitor electrode on a second side surface of the conductive porous base opposite to the first side surface and electrically connected to the upper electrode via the wiring electrode.

* * * * *